(12) United States Patent
Secatch

(10) Patent No.: US 7,506,281 B1
(45) Date of Patent: Mar. 17, 2009

(54) TWO-PASS METHOD FOR IMPLEMENTING A FLEXIBLE TESTBENCH

(75) Inventor: Stacey Secatch, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 422 days.

(21) Appl. No.: 11/131,750

(22) Filed: May 18, 2005

(51) Int. Cl.
*G06F 17/50* (2006.01)

(52) U.S. Cl. .............................................. 716/4; 716/5

(58) Field of Classification Search ......... 702/119–120; 703/13–15; 707/1; 716/1, 4–5, 16, 18; 714/37, 714/724
See application file for complete search history.

(56) References Cited

U.S. PATENT DOCUMENTS

| | | | |
|---|---|---|---|
| 6,477,683 B1 * | 11/2002 | Killian et al. ................... | 716/1 |
| 6,493,852 B1 | 12/2002 | Narain et al. | |
| 6,618,839 B1 | 9/2003 | Beardslee et al. | |
| 6,701,501 B2 | 3/2004 | Waters et al. | |
| 6,721,922 B1 | 4/2004 | Walters et al. | |
| 7,024,345 B1 * | 4/2006 | Stamm et al. .................. | 703/14 |
| 7,069,526 B2 | 6/2006 | Schubert et al. | |
| 7,219,315 B1 | 5/2007 | Stoye et al. | |
| 7,225,416 B1 * | 5/2007 | Pritchard et al. ............... | 716/4 |
| 2002/0166098 A1 * | 11/2002 | Chang et al. ................... | 716/1 |
| 2002/0183956 A1 * | 12/2002 | Nightingale ................. | 702/120 |
| 2003/0217341 A1 | 11/2003 | Rajsuman et al. | |
| 2004/0225973 A1 * | 11/2004 | Johnson ......................... | 716/4 |
| 2005/0004777 A1 * | 1/2005 | Houlihane ................. | 702/119 |
| 2006/0107141 A1 * | 5/2006 | Hekmatpour ............... | 714/724 |
| 2006/0190857 A1 * | 8/2006 | Likovich et al. ............... | 716/4 |

OTHER PUBLICATIONS

GDA Technologies, Inc.; "Configurable UART"; Product Brief—Overview Features; downloaded from www.gdatech.com/IP/pdf/UART-P.B.PDF; pp. 1-2, Aug. 2003 GDA Technologies Inc.
U.S. Appl. No. 11/344,477, filed Jan. 31, 2006, Edwards.

* cited by examiner

*Primary Examiner*—Paul Dinh
(74) *Attorney, Agent, or Firm*—Kevin T. Cuenot

(57) ABSTRACT

A multi-pass method of implementing a testbench can include, during a pre-processing pass, randomly selecting a configuration of the testbench and generating configuration data specifying the randomly selected configuration of the testbench. During a subsequent processing pass, the method can include compiling the testbench in accordance with the configuration data. Simulation can be performed using the testbench.

3 Claims, 2 Drawing Sheets

TWO-PASS METHOD FOR IMPLEMENTING A FLEXIBLE TESTBENCH

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Invention

This invention relates to the field of integrated circuits and, more particularly, to testing and verification of integrated circuit designs.

2. Description of the Related Art

Modern integrated circuits (ICs) are developed through the use of hardware description languages (HDLs). HDLs such as VERILOG, VHDL, and the like allow developers to create software-based representations of circuit designs. One advantage of using an HDL is the potential for code reuse from one design to another. This concept has been realized with the commercial availability of intellectual property (IP) cores.

In general, an IP core (hereafter "core") refers to a software representation of a semiconductor component that provides a processing function. Different varieties of cores exist. For example, some cores can provide basic functions. These cores can be included in a circuit design or, alternatively, can be used as subcomponents within a larger, more complex core. When used within a larger core, the subcomponents are not directly accessible except by other subcomponent cores within the larger core. Another variety of core can function as a logic bridge to software-based bus objects such as Peripheral Component Interconnect (PCI) and/or Advanced Microcontroller Bus Architecture (AMBA) busses.

Two or more cores can be said to be related when the cores perform similar functions. A general example of related cores is the case where one core is configured to encode data and another core is configured to decode data. In high level terms, one core performs a function, and the other core performs the inverse of the function. Another example of related cores can be found within a Generic Framing Procedure (GFP) core, such as the GFP Core available from Xilinx, Inc. of San Jose, Calif.

The Xilinx GFP core implements the International Telecommunication Union's GFP recommendation (G.7041/Y.1303). Generally, this core includes a MAP core and an UNMAP core. The MAP core receives client network protocol data on the system interface, encapsulates this data, and transmits the resulting frames on the line interface. The UNMAP core performs a similar process in reverse. The UNMAP core receives encapsulated data on the line interface and de-maps the frames to extract client network protocol data. The network protocol data is, in turn, transmitted on the system interface.

While complementary cores are similar in terms of functionality, each can offer one or more functions which may not be included within the other core. As such, the functionality of one complementary core cannot be thought of strictly as the inverse of the other. In illustration, a MAP core can include user programmable channel configurations, while the UNMAP core may not include such functionality. Similarly, the UNMAP core can include synchronization logic to detect frame boundaries, which is not needed in the MAP core.

Before a core is released for commercial use, it must be thoroughly tested and verified. The core must be tested to ensure that it functions properly and as expected, particularly as defined in the design specification. Due to the complexity of modern cores, however, testing requires a significant amount of time. Frequently, core testing/verification requires as much time, if not more, than developing the core itself. This problem is exacerbated when more than one core is to be tested. Such is the case, for example, with related or complementary cores.

One way of testing complementary cores is to place the two cores in a loop-back configuration and design a testbench for this configuration. A loop-back configuration refers to placing the two cores in line, one after the other. Using GFP cores as an example, in a loop-back configuration, test data can be provided to the MAP core. The output of the MAP core can be fed to the input of the UNMAP core. If the cores function properly, the output of the UNMAP core should be identical to the data fed to the MAP core as input.

A testbench, also referred to as a verification environment, refers to HDL descriptions that specify and verify the behavior of a device under test, in this case one or more cores. Generating a testbench involves describing the connections, events, and test vectors for different combinations of transactions involving the core(s). A testbench also refers to the code used to create a pre-determined input sequence to the cores, as well as the code responsible for observing the response.

Typically, testbenches are manually coded by a developer. As such, testbench development tends to be a time consuming and error-prone process. By placing two complementary cores in a loop-back configuration, the number of testbenches can be reduced as inverse functions of the two cores can be tested using a single testbench.

The loop-back technique of testing complementary cores, however, does have limitations. With reference to GFP, for example, an UNMAP core should have the ability to process any type of management frame that is allowed by its specification. The MAP core may be more restricted in terms of frame generation. That is, the UNMAP core from a given provider may need to process more types of frames than the MAP core, from the same provider, is capable of generating. Such can be the case as MAP and UNMAP cores may be sold separately by the provider. Accordingly, is it important for the UNMAP core to be able to process a large variety of frame types, particularly in the event that it is paired with a MAP core from a different provider.

When conducting loop-back tests, the provider typically pairs its own complementary cores together. This can lead to a situation in which a MAP core is unable to generate all frame types that the complementary UNMAP core should be able to process. In illustration, if the MAP core cannot generate frames with payloads attached, but the UNMAP core is to have the ability to process such frames, loop-back type testing will not provide an adequate means for testing the UNMAP core's ability to process frames with payloads attached.

Another technique for testing complementary cores is to create one testbench for testing each function of the cores, thereby ensuring that any functions not shared among the complementary cores would be adequately tested. By testing each core independently, however, a significant number of tests are required for each core despite any overlap in functionality between the two cores. This additional overhead in terms of creating testbenches significantly increases the overall time needed to test and verify the cores. In some cases, this technique amounts to doubling the amount of time otherwise needed for testing and/or verification. As testing and verification can require as much or more time than designing a core, it can be seen that testing complementary cores in this manner requires an unacceptable amount of additional time and overhead.

It would be beneficial to provide a technique for testing cores in a manner that overcomes the limitations described above.

SUMMARY OF THE INVENTION

The present invention provides a solution for testing and/or verification of intellectual property cores (cores) through the use of a flexible testbench design. One embodiment of the present invention can include a multi-pass method of implementing a testbench. During a pre-processing pass, a configuration of the testbench can be randomly selected and configuration data specifying the randomly selected configuration of the testbench can be generated. During a subsequent processing pass, the testbench can be compiled in accordance with the configuration data. Simulation can be performed using the testbench.

The step of generating configuration data can include automatically creating an include file to be used during the compiling step. The include file can specify at least one of a driver module or a monitor module of the testbench. Further, the include file can specify at least one core selected from a plurality of cores to be used with the testbench. The step of randomly selecting a configuration of the testbench can include selecting the at least one core at random. At least one configuration attribute of the core(s) can be selected at random also.

Another embodiment of the present invention can include a two-pass method of implementing a testbench including automatically generating test description data specifying a core to be used with the testbench and a configuration of the core during a first processing pass. During a second processing pass, the core and the testbench can be automatically configured at compile time in accordance with the test description data such that the testbench functions cooperatively with the core. Simulation can be performed upon the core using the testbench.

The step of automatically generating test description data can include creating an include file specifying the core to be used with the testbench, at least one configuration attribute of the core, and at least one component of the testbench to interact with the core. The core can be selected from a plurality of cores and one or more configuration attributes can be selected for the core. The plurality of cores from which the core is selected can include at least two complementary cores. In any case, the core(s) and/or the configuration attribute(s) of the core can be chosen at random.

The step of automatically generating test description data also can include selecting a seed for use in a randomization function used to select the core and/or the configuration attribute(s) of the core. Further, a driver and/or a monitor for the testbench can be selected for interacting with the core. One or more generic wrappers also can be generated which can configure the selected core(s) for simulation.

Yet another embodiment of the present invention can include a method of implementing a testbench in which configuration classes are executed. Execution of the configuration classes automatically generates configuration data specifying at least one core, a configuration of the at least one core, and at least one module of the testbench to be used in interacting with the at least one core. The testbench can be compiled by modifying code of the testbench in accordance with the configuration data. The testbench can be executed to perform simulation upon the core(s).

The step of executing configuration classes can include generating an include file specifying the core(s), the configuration of the core(s), and the module(s) of the testbench. One or more generic wrappers also can be created which configure the core(s) for execution with the testbench. The module(s) of the testbench can be a selected driver and/or a selected monitor. Accordingly, the compiling step can include altering the code of the testbench to specify the selected driver and/or the selected monitor. The step of executing configuration classes can include randomly selecting the at least one core from a plurality of cores. Further, one or more configuration attributes for the selected core(s) can be selected.

In one embodiment, the core(s) can be complementary cores in a loop-back configuration. In that case, the element(s) of the testbench can be a driver configured to communicate with one of the complementary cores and a monitor configured to communicate with another one of the complementary cores.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a solution for testing and/or verifying intellectual property cores (cores), including related or complementary cores. In accordance with the inventive arrangements disclosed herein, a two-pass methodology is provided which reduces the time needed for testing cores and further reduces the number of testbenches that must be created. Generally, during a first pass, one or more cores can be selected for testing. Particular features of the cores also can be selected for enablement during the testing process. In one embodiment, core and/or feature selection can be performed using a randomization technique. Use of randomization relieves test engineers from having to manually create different testbenches for testing different cores and core configurations. During a next pass, the testbench can be configured according to the selected core(s) and features. Vector simulation can be performed using the configured testbench. The process can be repeated so that different cores and different core configurations are tested in subsequent iterations.

Though the present invention will be discussed largely with reference to a Generic Framing Procedure (GFP) core, having a MAP core and an UNMAP core, the present invention is not so limited. It should be appreciated that the present invention is applicable to other varieties of cores and, as such, extends beyond the testing of a GFP core or its constituent cores. Other varieties of cores and complementary cores which can be used with the present invention can include, but are not limited to, synchronous and asynchronous first-in-first-out (FIFO) cores, encoder-decoder core pairs, individual cores, and the like.

Figure 1:
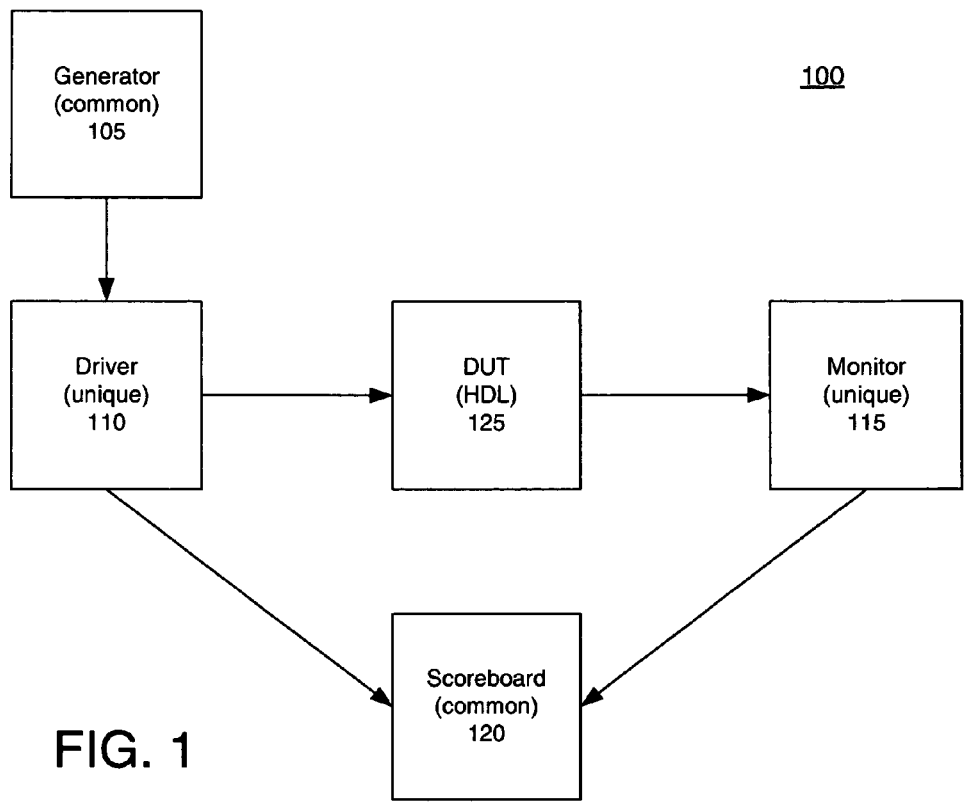
FIG. 1 is a block diagram illustrating a testbench configuration in accordance with one embodiment of the present invention.

FIG. 1 is a block diagram illustrating a testbench configuration 100 in accordance with one embodiment of the present invention. A testbench, or verification environment, refers to hardware description language (HDL) descriptions that specify and verify the behavior of an electrical circuit or, in this case, one or more cores. The elements of the testbench configuration 100 can be implemented as software modules executing in concert with, or by, an HDL simulator (not shown) within one or more suitable information processing systems.

The testbench configuration 100 can include a generator 105, a driver 110, a monitor 115, and a scoreboard 120. A device under test (DUT) 125, such as a core configured as described herein, also can be included. The generator 105 randomly constructs data units to be provided to the DUT 125. In the case where the DUT 125 is a GFP core, for example, the generator 105 can randomly construct GFP frames to be provided to the DUT 125.

The driver 110 can transmit constructed data units, such as a payload for a GFP frame, to the DUT 125. The monitor 115 receives these processed data units as output from the DUT 125. Continuing with the GFP example, the output can be a complete GFP frame. The driver 110 and the monitor 115 can be referred to as unique modules since the particular driver and monitor used can vary according to the selected DUT 125 and DUT configuration, which can be selected by a user or at random.

The scoreboard 120 examines the output units to determine whether the DUT 125 behaved correctly. In this case, the scoreboard can determine whether, given the payload and the input control signals provided to the DUT 125, the constructed GFP frame output from the DUT 125 is correct. The generator 105 and scoreboard 120 can be referred to as common modules since these modules often are common to most test environment configurations. As such, the generator 105 and the scoreboard 120 can be hard-coded into the test environment.

While the testbench configuration 100 can be coded in an HDL, in one embodiment, the testbench configuration 100 can be coded in a hardware verification language (HVL) such as OpenVera™, or another HVL having a randomization engine. OpenVera is a concurrent, imperative language designed for writing testbenches. It executes in concert with an HDL simulator and can both provide stimulus to the simulator and observe the results. In addition to the conventional high-level imperative language constructs, such as conditionals, loops, functions, strings, and associative arrays, OpenVera provides extensive facilities for generating biased random patterns and monitoring what values particular variables take on during the simulation.

OpenVera provides a broad range of constructs which enable constraint-driven, random test stimulus generation, real time self-checking, functional coverage, and temporal assertions. OpenVera further provides a robust randomization engine which supports randomization of the testbench with respect to module selection and module configuration. The randomization functions of an HVL, such as OpenVera, can be used to randomize the configuration elements which can be controlled by the testbench. It should be appreciated, however, that the present invention is not limited by the particular HVL used, so long as the selected HVL provides randomization functions substantially as described herein.

Conventional HVLs do not allow generics to be changed at run time. Instead, these values must be fixed at compile time. To adequately test a given core, or core set, however, the generics which configure the core must be set to all of the valid values at some point during the testing process. This ensures that all, or most, configurations of the core are subjected to testing.

In accordance with the inventive arrangements disclosed herein, a two-pass methodology can be implemented which utilizes the randomization engine of the HVL used to select particular cores to be tested as well as particular configurations for the selected cores. Thus, a testbench having the capability to test a plurality of cores can be written in an HVL, such that the randomization engine can be used to select a particular core or cores to serve as the DUT. In one embodiment, the testbench can be configured to test two complementary cores individually. Alternatively, two complementary cores can be tested in a loop-back configuration. The testbench also can be written to test a variety of different configurations for each core. The core configuration, similar to core selection, can be handled using the randomization engine of the HVL. With core selection and configuration identified, testbench configuration in terms of unique module selection can be performed.

Figure 2:
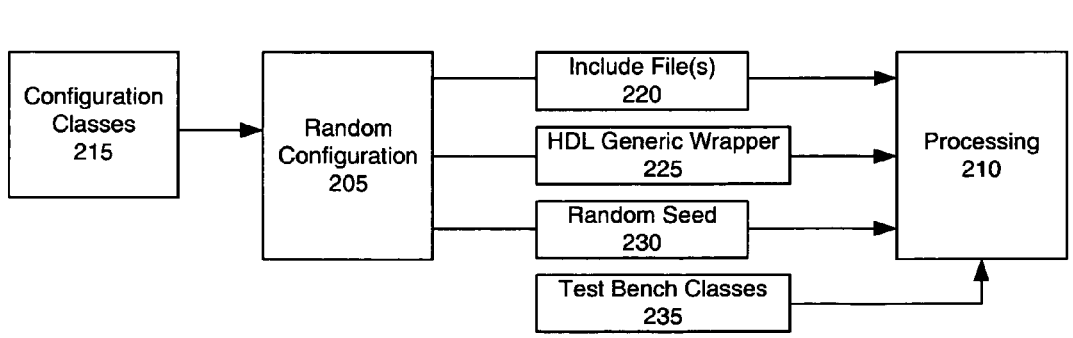
FIG. 2 is a block diagram illustrating a method of implementing a testbench in accordance with the inventive arrangements disclosed herein.

FIG. 2 is a block diagram illustrating a method of implementing a testbench in accordance with the inventive arrangements disclosed herein. As shown, the block diagram includes two processing blocks 205 and 210, each representing a processing stage, or pass. Random configuration block 205 illustrates the processing of the configuration classes 215. The configuration classes 215 can be coded in an HVL. The configuration classes 215 specify a valid core configuration. The configuration classes 215 specify which features of a given core can coexist with one another or that must be selected together. For example, the configuration class 215 can specify a configuration constraint which states that if feature A of the core is selected or activated, so too must feature B, or alternatively, if feature A is selected, then feature B must not be selected or activated. The configuration class 215 also can indicate the range of allowable values for different generics. Further, the configuration classes 215 can specify a frequency that various features of the core are to be tested by a given testbench.

When the configuration classes 215 are executed in random configuration block 205, the randomization engine of the HVL can be used to generate configuration data as output. Processing block 210 illustrates the configuration/execution of the testbench classes 235 using the configuration data generated by the random configuration block 205.

As shown, random configuration block 205 operates on configuration classes 215 to produce configuration data comprising include file(s) 220, HDL generic wrapper(s) 225, and a random seed 230. The include files 220 can be coded in an HVL and specify information such as which core of the plurality of cores specified by the testbench classes 235 will be tested. The include files 220 also specify attributes defining the configuration of the selected core and values that are to be assigned to those attributes. The selection of these data items can be performed using the randomization engine of the HVL. The random seed 235 is used in random configuration block 205 and can be stored for recreating the test conditions at some point in the future. Further, the random seed 230 can be provided to processing block 210 for use in generating random vectors to be applied to the selected core(s).

With reference to FIG. 1, the include files 220 can specify a particular driver and monitor to be used as part of the testbench classes 235 along with the selected core in processing block 210. That is, depending upon the selected core and core configuration, a particular driver can be selected from a plurality of drivers and a particular monitor can be selected from a plurality of monitors for use in executing the testbench classes 235 in processing block 210.

The HDL generic wrappers 225 are tasked with modifying the configuration of the selected core(s) to be tested by the testbench classes 235. In one embodiment of the present invention, there can be a one-to-one correspondence between each include file 220 and each HDL generic wrapper 225. The include files 220 and the HDL generic wrappers 225 can specify similar data items. Since the HDL generic wrappers 225 configure the core(s), however, the HDL generic wrappers 225 need not include information relating to module selections for the testbench classes 235. That is, the HDL generic wrappers 225 need not specify driver or monitor selection as do the include files 220. Accordingly, the include files 220 can include more information than may be specified by the HDL generic wrappers 225. An example of an include file that can be generated by random configuration block 205 is shown in Table 1.

TABLE 1

Example of Include File

| #define D_USE_MAP_DRV | 1 |
| #define D_USE_MAP_MON | 1 |
| //#define D_USE_UNMAP_DRV | 0 |
| //#define D_USE_UNMAP_MON | 0 |

The define statements generated in the include file dictate object selection when the testbench is compiled prior to simulation as performed by processing block 210. As shown in Table 1, the include file has assigned values of 1 to the D_USE_MAP_DRV and D_USE_MAP_MON symbolic constants. These symbolic constants can be used to specify which driver and monitor are to be used in the testbench for vector simulation. Selection of a particular driver and monitor varies with the particular type of core that is selected. In this case, a MAP core has been randomly selected for verification. Accordingly, a MAP driver and MAP monitor have been enabled by defining D_USE_MAP_DRV and D_USE_MAP_MON.

The UNMAP driver and UNMAP monitor have been deselected by placing remark indicators prior to each statement. This technique can be used when the testbench uses an existence check method of determining object selection. If a value check technique is used, then the remark indicators would not be used. In a value check, the values of the symbolic constants would dictate object selection rather than whether the symbolic constants were defined.

Once the configuration data is generated by the first processing pass, the core can be subjected to vector simulation. As used herein, a vector can include a single value or a plurality of values. As such, the terms "simulation" and "vector simulation" have been used herein to reference the process of providing one or more inputs to a DUT during execution of a testbench. Processing block 210 receives the configuration data comprising the include files 220, the HDL generic wrappers 225, and the random seed 230 from randomization block 205. Processing block 210 further receives the testbench classes 235 for execution.

Thus, in the case of testing a GFP core, GFP classes can be provided to processing block 210 for use in executing the testbench. According to one embodiment, the GFP classes can include the data necessary to create both MAP and UNMAP object cores. Accordingly, processing block 210 can, based upon the configuration data, create either object as needed. With this data, processing block 210 can compile the testbench so that it is configured as specified in the include files. Simulation then can be performed using the selected core(s).

During the second pass, the define statements specified in the include file shown in Table 1 can be used to alter code in the testbench. This changes the code that is ultimately compiled for use by the HDL simulator. An example of the source code used to declare objects in the testbench environment is shown in Table 2. Table 2 is illustrative of the source code comprising the testbench classes 235 and, as such, is responsible for creating the objects shown in FIG. 1.

TABLE 2

Example of Source Code Declaring Objects

```
this.sb        = new("gfp_sb", this.fra_drv_to_sb, this.mon_
                     to_sb);
this.gen       = new("gfp_gen", *, this, this.gen_to_fra_drv,
                     this.gen_to_cmd_drv);
#ifdef D_USE_MAP_DRV
   this.fra_drv = new("gfp_driver", 0, m_sys, this, this.gen_to_
                     fra_drv, this.fra_drv_to_sb);
#endif
#ifdef D_USE_MAP_MON
   this.mon    = new("gfp_monitor", 0, m_line, this this.mon_
                     to_sb);
#endif
#ifdef D_USE_UNMAP_DRV
   this.fra_drv = new("gfp_driver", 0, u_line, this, this.gen_to_
                     fra_drv, this.fra_drv_to_sb);
#endif
#ifdef D_USE_UNMAP_MON
   this.mon    = new("gfp_monitor", 0, u_sys, this, this.mon_
                     to_sb);
#endif
```

The series of if statements illustrated in Table 2 selectively declares objects such as which driver and monitor to use based upon which symbolic constants have been defined in the include file. In this case, D_USE_MAP_DRV and D_USE_MAP_MON have been defined as the others were remarked out. Accordingly, the statements "this.fra_drv=new ("gfp_driver", 0, m_sys, this, this.gen_to_fra_drv, this- .fra_drv_to_sb);" and "this.mon=new("gfp_monitor", 0, m_line, this this.mon_to_sb);" are executed. As noted, if existence checking is not used, then value checking can be used.

Particular functions called inside of the common modules of the testbench may need to know which core has been selected. Such is the case as common functions may need to provide particular features which the selected core may require. In addition to selecting a core, information regarding user specified generics, which configure the core, may need to be known by the functions called inside of the common modules of the testbench. Such information may be required to correctly test the core. Table 3 illustrates the case where a particular core is selected by the generated include file as well as a particular feature or configuration.

TABLE 3

Example of Include File Specifying
Core Selection and Core Configuration

| #define USE_UNMAP_MON | 1 |
| #define UNMAP_SYNC_DELTA 6 | |

For example, when a MAP core is selected, the first frame driven by the user onto the system interface is also seen on the line interface. The UNMAP core, however, undergoes a synchronization procedure to lock onto a data stream coming into the core on the line interface. Any frames processed by the synchronization state machine are discarded and never seen by the user on the system interface. This is correct behavior, not an erroneously dropped frame. Furthermore, the ITUT specification allows the user to specify the number of frames counted in the pre-synchronization state. This number is passed into the UNMAP core by means of a user configurable generic. The testbench must be informed of the quantity of frames dropped in addition to the quality measures used to determine whether frames will be dropped. In this case the include file selects the UNMAP core and further specifies that 6 frames are dropped in order to synchronize.

Table 4 below illustrates the source code that can be included within a generator or a scoreboard component of a testbench. The source code illustrates how such a module can learn of the parameters specified in the include file of Table 3.

TABLE 4

Example of Source Code to be Included in Testbench Module(s)

```
integer sacrificial_frame_count;
// determine the number of frames that will enter the core, but
//    not be see on the output
if (USE_UNMAP_MON) {
    // User can choose number of valid frames required before
    //    core determines it has locked onto a data stream
    sacrificial_frame_count = UNMAP_SYNC_DELTA;
} else {
    // the very first data into the MAP core appears on the output
    sacrificial_frame_count = 0;
}
```

The inventive arrangements disclosed herein also can be used to implement a loop-back configuration. To do so, the code which controls the random selection of core(s) and core configuration(s) can be modified to select two complementary cores. The configuration data generated by the first processing pass causes two complementary cores to be instantiated. In the case of GFP, a MAP core and an UNMAP core can be placed in line, or back-to-back. An example of an include file specifying a loop-back configuration is shown in Table 5.

TABLE 5

Example of Include File for Loop-Back Configuration

| #define D_USE_MAP_DRV | 1 |
| //#define D_USE_MAP_MON | 0 |
| //#define D_USE_UNMAP_DRV | 0 |
| #define D_USE_UNMAP_MON | 1 |

Because the MAP core output feeds directly into the UNMAP core input in a loop-back configuration, a MAP driver is used to drive the cores. As shown, the MAP driver symbolic constant is defined and assigned a value of 1. Output of the cores is monitored at the output of the UNMAP core using an UNMAP monitor. Accordingly, the UNMAP symbolic constant is defined and assigned a value of 1. The MAP monitor and UNMAP drivers have been "remarked" out. Accordingly, using an existence check, the MAP driver and UNMAP monitor will be included in the testbench. Still, if desired, value checking can be used, in which case the MAP monitor and UNMAP driver symbolic constants would not be remarked out.

It should be appreciated that more than one generator, monitor, scoreboard, and/or driver can be used within a testbench. In illustration, if a loop-back configuration is used to test a MAP core and an UNMAP core, a MAP monitor can be placed at the output of the MAP core and an UNMAP monitor can be placed at the output of the UNMAP core. In another example, referring to a single core testbench configuration, an additional user interface, called a host interface, can be included in the core. If so, an additional generator, driver, monitor, and scoreboard can be included in the testbench to verify the host interface. As such, whether a single core is being tested, or more than one core is being tested, more than one generator, monitor, scoreboard, and/or driver can be used with the testbench.

Figure 3:
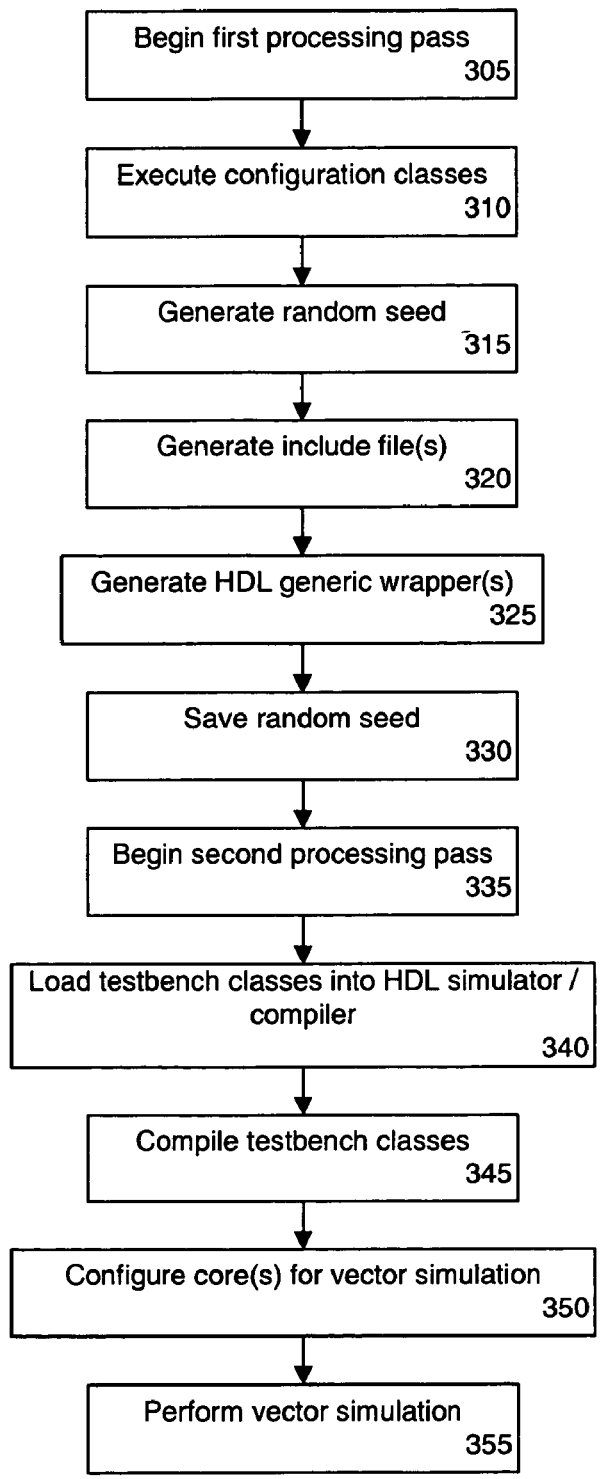
FIG. 3 is a flow chart illustrating a method of implementing a testbench in accordance with the inventive arrangements disclosed herein.

FIG. 3 is a flow chart illustrating a method 300 of implementing a testbench in accordance with another embodiment of the present invention. Method 300 illustrates a multi-pass methodology for performing testbench analysis. While a testbench for verifying a GFP core is described, it should be appreciated that the present invention can be used to test and/or verify any of a variety of different cores. As such, the present invention is not so limited.

The method 300 can begin in a state where a testbench has been written in an HVL having a randomization engine. The testbench can be written in such a way that it can test any of a plurality of different cores and different configurations for each of the cores. In one embodiment, the cores that can be tested by the testbench can be complementary cores. In illustration and with reference to GFP, the testbench can be coded to test a MAP core, an UNMAP core, or both. Further, any of a variety of different configurations can be defined for either one or both of the cores.

In step 305, a first processing pass can begin. In one embodiment, the first processing pass is a pre-compilation, or pre-processing pass. Accordingly, in step 310, configuration classes can be executed. The configuration classes can be coded in an HVL having a randomization engine. In executing the configuration classes, a random seed can be generated in step 315. Typically, the random seed is taken from the system clock, though the present invention is not so limited. In any case, the random seed is used by the randomization engine during execution of the configuration classes to generate configuration data.

Thus, in step 320, one or more include files automatically can be generated. The include files also can be coded in an HVL. As noted, the include files can specify which core, or cores, from a plurality of cores are to be tested by the testbench, particular modules of the testbench to be used such as monitor(s), driver(s), generator(s), and/or scoreboard(s), the configuration of the core(s) to be used with the testbench, as well as configuration(s) for modules of the testbench.

Core and core selection can be performed through randomization. Once a core is selected, one or more parameters of the core can be selected which, when assigned values, define the desired core configuration for testing and/or verification. The parameters and values for each selected core parameter can be randomly generated as well. The modules to be used for the testbench, i.e. any necessary drivers and/or monitors, can be selected based upon the core configuration and specified in the include file. Though randomization can be used, in another embodiment, user input can be received which specifies core selection and core configuration.

In step 325, the HDL generic wrapper(s) can be generated. The HDL generic wrapper(s) include information necessary to configure the core(s) to be tested. In step 330, the random seed is saved for later use.

In step 335, the second processing pass can begin. Accordingly, in step 340, testbench classes can be loaded into a compiler or an HDL simulator having a compiler. In step 345, the testbench classes can be compiled. At compile time, the include file(s) are accessed to configure the testbench. In step 350, the HDL generic wrapper configures the core(s) for testing and/or verification. In step 355, the testbench can be executed within the HDL simulator. Accordingly the selected core, or cores, are subjected to vector simulation using the testbench and the HDL simulator. The random seed used for core selection and configuration also can be used to generate random vectors to be applied to the core(s) under test. Use of randomization to generate vectors relieves test engineers from having to rewrite a plurality of different vectors for each testbench scenario.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A multi-pass method of implementing a testbench comprising:
   during a pre-processing pass:
   randomly selecting a configuration of the testbench comprising randomly and automatically selecting at least one core from a plurality of cores as a device under test using a randomization engine comprising a random seed, wherein randomly selecting one core from a plurality of cores comprises:
   randomly selecting at least a first core and selecting a second core that is complementary to the first core; and
   generating configuration data that places the first core and the second core in a loopback configuration within the testbench, wherein the configuration data comprises at least one randomly selected configuration attribute;
   generating configuration data specifying the randomly selected configuration of the testbench;
   during a subsequent processing pass, compiling the testbench in accordance with the configuration data; and
   performing simulation using the testbench.

2. The method of claim 1, said step of generating configuration data further comprising, responsive to randomly selecting at least one core, automatically creating an include file that selects at least one of a driver module or a monitor module matching the at least one core randomly selected from the plurality of cores, wherein the include file is to be used in said compiling step.

3. The method of claim 1, said step of randomly selecting a configuration of the testbench further comprising selecting at least one configuration attribute for the at least one core selected as the device under test at random.

* * * * *